United States Patent

[11] 3,591,837

[72] Inventor John L. Boyer
El Segundo, Calif.
[21] Appl. No. 703,370
[22] Filed Feb. 6, 1968
[45] Patented July 6, 1971
[73] Assignee International Rectifier Corporation
Los Angeles, Calif.

[54] GLASS-SEALED ALLOYED SEMICONDUCTOR DEVICE
7 Claims, 3 Drawing Figs.

[52] U.S. Cl. .......... 317/234 R, 317/234 G
[51] Int. Cl. .......... H01l 1/04
[50] Field of Search .......... 317/234; 29/25.3

[56] References Cited
UNITED STATES PATENTS
3,261,075 7/1966 Carman .......... 29/25.3

*Primary Examiner*—John W. Huckert
*Assistant Examiner*—R. F. Polissack
*Attorney*—Ostrolenk, Faber, Gerb & Soffen

ABSTRACT: A semiconductor device is formed having a silicon wafer which is assembled between molybdenum expansion plates with junction-producing solders between the interfaces of the plates and wafer. A glass ring is secured about the outer periphery of the upper expansion plate in an initial manufacturing step, the upper plate being smaller in diameter than the wafer. The combined upper plate and ring is placed in engagement with the upper surface of the wafer and, in single heating step, the outer periphery of the ring is fused to the exposed outer periphery of the wafer and the impurity containing solder is alloyed into the wafer to form one or more junctions.

INVENTOR.
JOHN L. BOYER

BY

OSTROLENK, FABER, GERB & SOFFEN
ATTORNEYS

GLASS-SEALED ALLOYED SEMICONDUCTOR DEVICE

This invention relates to semiconductor devices and more particularly relates to a novel glass-sealed semiconductor device which can be used in a pressure-assembled system and to the method of manufacture thereof.

A primary object of this invention is to provide a novel hermetically sealed semiconductor device which can be manufactured in an inexpensive manner.

A further object of this invention is to provide a novel semiconductor device in which a hermetically sealing glass ring encloses the wafer with the junctions being simultaneously formed in the wafer.

These and other objects of my invention will become apparent from the following description taken in connection with the accompanying drawing, in which.

Referring now to the figures, there is provided a semiconductor wafer 10 which may be of silicon having a diameter of 1¼ inches and a thickness of 0.01 inch. Wafer 10 may be of the N conductivity type, or, if desired, any desired junction sequence can be formed in the wafer. Upper and lower expansion plates 11 and 12, which may be of molybdenum or tungsten or the like are then provided with dimensions of 1 inch in diameter and 1¼ inches in diameter, respectively, and thicknesses of 0.04 inches.

Figure 1:
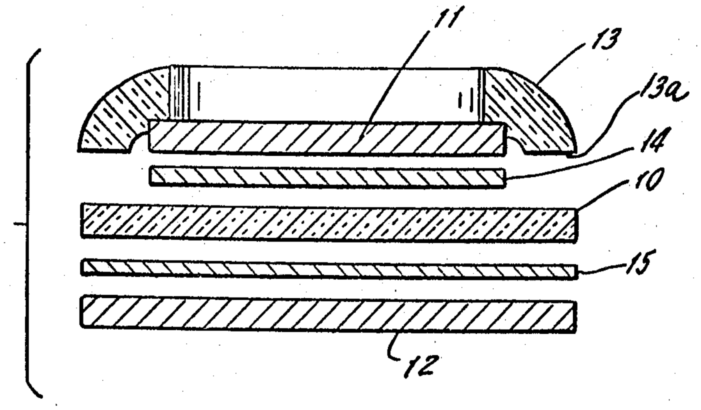
FIG. 1 is an exploded cross-sectional view of a semiconductor device constructed in accordance with the invention.
Figure 2:
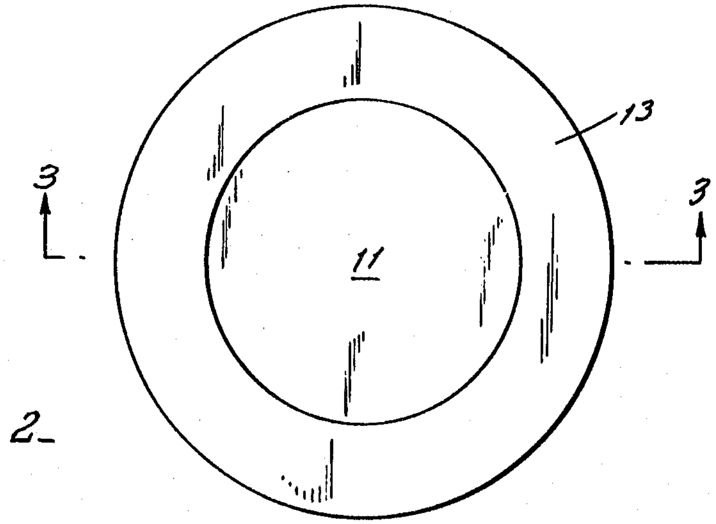
FIG. 2 is a top view of the device of FIG. 1 after the assembly thereof.

In accordance with the invention, upper plate 11 has the outer periphery thereof sealed to a glass ring 13 which may be of low-thermal expansion glass such as type 705 and which is fused to plate 11 by heating at a temperature of 1,000° C. for about 5 minutes. Alternatively, ring 13 can be cemented to plate 11. The preassembled plate 11 and ring 13 and solder wafers 14 and 15 are then stacked atop plate 12 as shown in FIG. 1, with ring 13 resting on the outer periphery of the upper surface of wafer 10.

Figure 3:
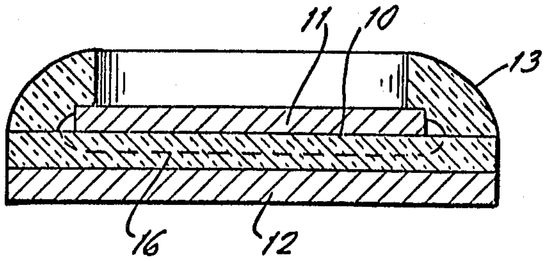
FIG. 3 is a cross-sectional view of FIG. 2 taken across the section line 3–3 in FIG. 2.

Solder disc 14 may be formed of aluminum whereby P-type impurities can be alloyed into the upper surface of N-TYPE wafer 10 in order to form a PN junction 16 as shown in FIG. 3.

Wafer 15 may be a pure tin wafer for the sole purpose of securing plate 12 to wafer 10 or alternatively, could contain impurity materials for forming a further junction in wafer 10.

The assemblage is then held together under pressure and is heated at 910° C. for about 3 minutes to cause alloying of wafer 14 into wafer 10 and plate 11 and to cause the fusion of the lower slot 13a of ring 13 to wafer 11 thereby to form a complete hermetic seal around the periphery of wafer 10, thus sealing the exposed junction 16. Note that the junction 16 is formed during this same heating cycle.

The completed device may then be used in any desired well-known pressure-connected system by the provision of suitable studs which engage the exposed opposite surfaces of plates 11 and 12 in the manner shown in U.S. Pat. No. 3,293,508.

Although this invention has been described with respect to its preferred embodiments, it will be understood that many variations and modifications will be obvious to those skilled in the art, and it is preferred, therefore, that the scope of the invention be limited not by the specific disclosure herein, but only by the appended claims.

The embodiments of the invention in which I claim an exclusive privilege or property are defined as follows:

1. A sealed semiconductor device comprising a semiconductor wafer; top and bottom expansion plates extending across the top and bottom surfaces of said wafer; said wafer periphery extending beyond the periphery of said top expansion plate; and a glass ring having an inner diameter portion thereof fused to the outer periphery of said upper expansion plate and an outer diameter portion thereof fused to an outer peripheral portion of said wafer.

2. The device of claim 1, in which a central portion of said upper plate is exposed for electrical connection.

3. The device of claim 1, which includes solder means between at least one of the interfaces between said wafer and said upper and lower expansion plates; said solder means alloyed into the said interface and containing impurities of one of the conductivity types.

4. A device of claim 3, wherein said solder means is positioned between each of said interfaces.

5. The method of forming a hermetically sealed semiconductor device comprising the steps of fusing the inner diameter of a glass ring to the outer periphery of an upper expansion plate, placing a semiconductor wafer in contact with the bottom surface of said upper expansion plate, and thereafter fusing the outer periphery of said glass ring to the outer peripheral surface of said semiconductor wafer by heating.

6. The method of claim 5 which includes the steps of securing a bottom expansion plate to the bottom surface of said wafer before connection of said wafer to said upper expansion plate.

7. The method of claim 6 which includes the alloying of impurity-containing solder into at least one of the surfaces of said wafer during the heating to fuse said glass ring to said semiconductor wafer.